United States Patent [19]
Horn et al.

[11] Patent Number: 4,636,751
[45] Date of Patent: Jan. 13, 1987

[54] COAXIAL CAVITY GUNN OSCILLATOR USING PROBE COUPLED MICROSTRIP

[75] Inventors: Robert E. Horn, Middletown, N.J.; Harold Jacobs, deceased, late of West Long Branch, N.J., by Lydia S. Jacobs, executrix

[73] Assignee: The United States of America as represented by the Secretary of the Army, Washington, D.C.

[21] Appl. No.: 679,972

[22] Filed: Dec. 10, 1984

[51] Int. Cl.[4] ............................................. H03B 7/06
[52] U.S. Cl. .................................. 331/96; 331/107 G
[58] Field of Search ............. 331/96, 107 G, 107 DP, 331/107 SL; 333/230, 254

[56] References Cited
U.S. PATENT DOCUMENTS 3,702,445 11/1972 Forterre .................. 331/107 SL X
3,878,480 4/1975 Hulderman et al. ................. 331/96
4,079,341 3/1978 Linn et al. ............................. 331/96

Primary Examiner—Eugene R. LaRoche
Assistant Examiner—Robert J. Pascal
Attorney, Agent, or Firm—Sheldon Kanars; Jeremiah G. Murray; Maurice W. Ryan

[57] ABSTRACT

A millimeter wave microstrip transmission line is coupled to a solid state mechanically tunable cylindrical resonating coaxial cavity millimeter-wave oscillator by means of a probe extending linearly from the microstrip through an access slot in the cylindrical cavity wall into the zone of optimum electric field strength in the oscillator cavity to effect the translation of a TEM wave from the resonating cavity to the microstrip line at optimum power transfer and without wave mode change.

3 Claims, 4 Drawing Figures

COAXIAL CAVITY GUNN OSCILLATOR USING PROBE COUPLED MICROSTRIP

The invention described herein may be manufactured, used, and licensed by or for the Government of the United States of America for Governmental purposes without the payment to us, or any of us, of any royalties thereon.

BACKGROUND OF THE INVENTION

The technical field in which this invention resides is that of millimeter-wave solid state oscillators and, more particularly, to the coupling of such oscillators to millimeter-wave transmission systems, and to accomplish this with minimum impedance mismatch and, consequently, maximum power transfer of transverse electromagnetic mode waves generated in such resonating cavity oscillators into TEM waveguides, microstrip transmission lines and the like wave conductive elements.

In the copending applications of Horn et al entitled "Image Line Voltage Controlled Oscillator With Replaceable Components", Ser. No. 679,971 and "An Integrated Varactor Tuned Coaxial Gunn Oscillator For 60 GHz Operation", Ser. No. 679,974 both filed Dec. 10, 1984, Gunn oscillator devices are shown for the generation of millimeter-wave energy outputs, with the outputs being finally controlled by ancillary electronically tuned oscillator devices. In both of these disclosures, the mode of take-off for the generated energy wave is through a wave-conductive element which is mounted atop and close to one end of the resonating cavity of the solid state mechanically tuned oscillator, preferably using a Gunn diode. In such known arrangements, while the normally acceptable limits of coupling efficiency are available, optimum power transfer is lost because the connection point for the wave guide coupling into the oscillator cavity is removed from the zone of maximum electrical field strength of the wave which is generated. The prior art, then, in general, shows arrangements where power takeoff of generated waves from oscillator devices in this technology normally involves the takeoff at some random point at or near the end of the resonating coaxial cavity of the oscillator element used in the device. There has, up to the time of the present invention, been no discernable effort to maximize the power transfer by effectively locating the point of transfer between the millimeter-wave generating apparatus and the transmission line, or its link from the oscillator element into a transmission line.

The presently known and used millimeter wavelength type oscillators generally use high frequency oscillator elements as their main source of wavelength generation. These devices find particularly suitable applications in radar and communications circuits. In the frequency ranges of interest, that is to say 35 GHz to about 300 GHz, low R.F. power levels are the general rule. The relatively high operating frequencies and related short wavelengths of the outputs require extremely precise construction of the oscillator physical parts. For these reasons, it is extremely important to minimize power loses between the various discretely discernible portions and circuit elements of such arrangements. In order to benefit from the relatively high stability of mechanically tuned diode units such as the Gunn oscillator, it is advantageous to precisely as possible match the elements used as connections and translation modes into other parts of the circuit. It is therefore understandably desirable to provide a fixed type maximum power transfer point for translation of the generated wave into its next medium or transmission step.

With this then being the state of the art, we conceived and developed our invention with the principal object of providing a maximum power transfer method and apparatus for matching Gunn diode outputs with transmission line microstrips.

A further object of the invention is to provide a method and apparatus for the maximum power transfer with minimum impedance mismatch of a Gunn diode output to a microstrip line by means of a fixed probe extending from the microstrip line into the oscillator resonating coaxial cavity zone of maximum electric field strength with respect to the energy wave being generated therein.

A further and important object of the invention is to provide a method of translating the millimeter-wave energy output developed in the resonating cavity of a Gunn oscillator into a millimeter-wave transmission line, not only with maximum power transfer, but without any significant change of mode from the transverse electromagnetic mode of the generated wave with the transverse electromagnetic propagation mode in the transmission line.

The apparatus and system of our invention has found particularly advantageous utilization in the realization of these objectives and purposes.

SUMMARY OF THE INVENTION

In general, the method according to our invention comprehends the coupling of a millimeter-wave power output from a cylindrical coaxial cavity Gunn oscillator to a millimeter-wave transmission line which comprises disposing and maintaining a probe connection from said microwave transmission line at substantially the maximum electric field strength center of an energy wave form generated in the cavity of said oscillator. More specifically, the method according to our invention may be effectively accomplished by disposing and maintaining the probe extending from the microstrip transmission line into the point of maximum electric field strength by inserting the probe at the approximate midpoint of the longitudinal dimension of the oscillator cylindrical cavity.

The inventive method places the location of the probe at any point into a zone of electric field strength not less than 90% of the maximum electric field strength developed in the oscillator resonating cavity.

The method according to our invention is utilized advantageously when the probe is in linear aligned registration with the microstrip transmission line.

Apparatus in accordance with our invention comprises, in combination, a housing having a variable height resonating coaxial cavity cylindrical in shape with an access slot in a cylindrical cavity wall thereof located centrally of the longitudinal dimension of the cavity; a solid state mechanically tunable element adjustably movable in said housing capable of producing a waveform energy output of a frequency relative to its position in said resonating cavity; a microstrip transmission line juxtaposed to said resonating cavity; a probe connected to and extending from said transmission line, through said slot, and into said cavity; and position adjustment means on said mechanically tunable element operably accessible exteriorly of said housing.

The apparatus according to the invention is advantageously provided with threaded elements in order that tunable adjustments can be made on the Gunn diode. The threaded engagement of bottom cavity portions and tuning posts on the Gunn diode permit the variation in the resonating cavity height which can effect desired frequency changes for the oscillator.

The above-described and other distinctive and advantageous features of our invention will become the more readily understood from the following detailed description of the invention read in the light of the appended drawing.

BRIEF DESCRIPTION OF THE DRAWING

The invention will now be described in greater detail and with greater specificity with particular reference to the appended drawing wherein.

DETAILED DESCRIPTION

Figure 1:
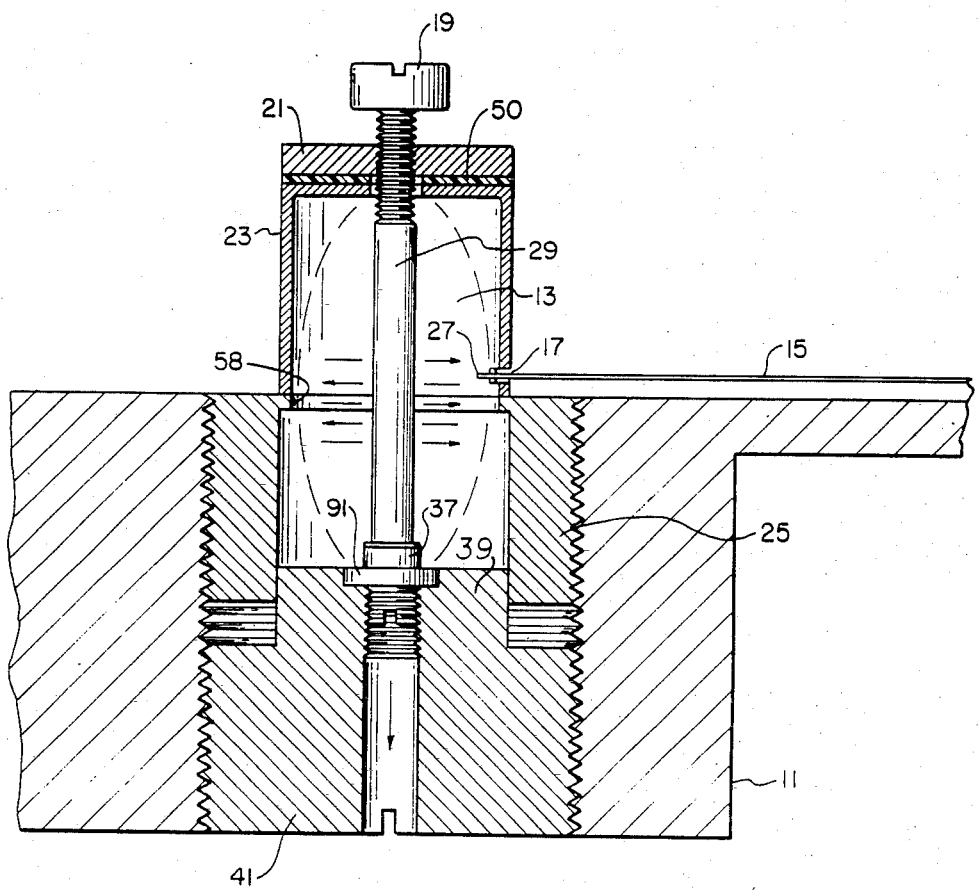
FIG. 1 is an elevational-sectional view taken through the center of an apparatus embodiment according to the invention, showing the relative arrangement of apparatus components and a portion of the housing in which the assembly mounts.

With reference to FIG. 1, a housing, indicated generally at 11, which may be a heat sink or the like structure suitable for mounting in a chassis or framework supporting the overall apparatus according to the invention, is shown in section, with threadedly inserted elements which define a resonating cavity for an oscillator. The exteriorly threaded sections which threadedly engage the housing inner threaded bore are, respectively, a cavity bottom cylinder 25 element and a cavity bottom closure cylinder 41. Closure cylinder 41 is provided with a cavity bottom plug 39 which defines the lower circular surface wall of a cylindrical resonating cavity 13. The upper portion of resonating cavity 13 is defined by an upper cavity cylinder 23 mounted atop the housing 11 to define an upwardly exending portion of the assembly.

A Gunn diode assembly comprising a tuning post knob 19, a diode movable element 37, mounted on diode mount 91, and a tuning post 29, is arranged coaxially in resonating cavity 13 with the upper threaded portion of the tuning post engaged in a threaded bore of a top mount 21 which mounts atop the top closure wall of the resonating cavity 13. Adjustment of the resonating cavity volume is accomplished by turning the cavity bottom closure cylinder 41 inwardly or outwardly as desired in its threaded engagement with the housing, and then adjusting Gunn diode tuning post 29 by turning the post knob 19 clockwise or counterclockwise according to the direction in which the cavity bottom closure cylinder had been turned. The resultant setting defines a cavity 13 having a height corresponding to the desired frequency of oscillation sought to be set with the Gunn diode.

Figure 2:
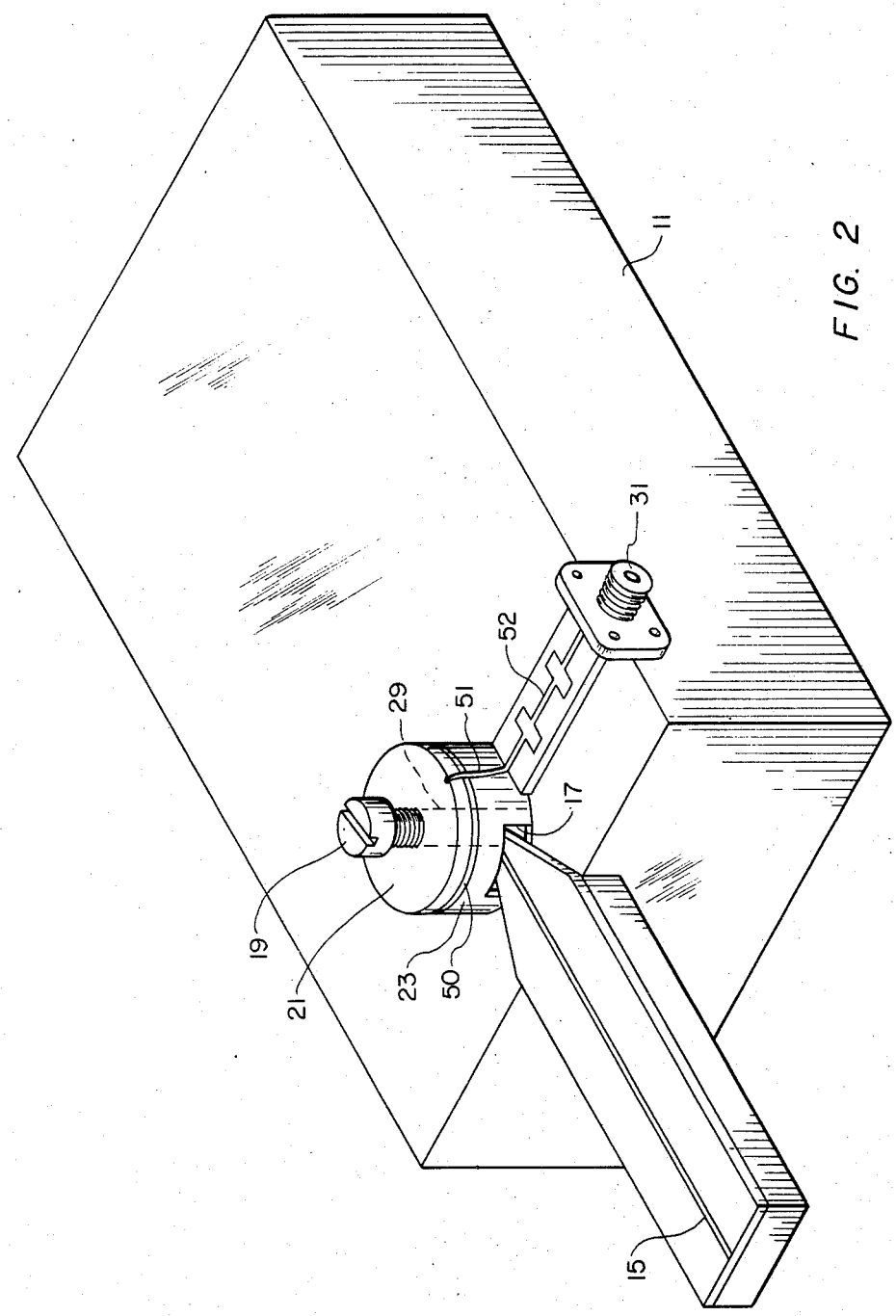
FIG. 2 is an isometric view of apparatus according to the invention assembled on a suitable housing such as a chassis or heat sink showing the exterior features of the various components in the combinations.

FIG. 2 of the drawing shows the overall arrangement in an external isometric view, all elements being mounted on a suitable housing 11 and with a Gunn diode input bias connection 31 provided.

A coupling slot 17 is formed in the outer cylindrical wall of the cavity top cylinder 23. A microstrip line 15 is affixed to the top of housing 11 and aligned linearly with the coupling slot 17. A probe 27 as show in FIG. 1 connects from the end of microstrip line 15, extends through slot 17 and into the interior of the cavity 13. The location of the probe is most advantageously selected with respect to the vertical position of the cavity so that the probe will repose in the zone of maximum electric field strength of the millimeter-wave generated in the oscillator cavity. As can be seen from the drawing, FIG. 1, in particular, the relationship of the probe to the exact center of the vertical dimension of the cavity can be varied within the structural limits of the apparatus components by turning the cavity bottom closure clockwise or counter-clockwise in its threads, while effecting a corresponding movement of the Gunn diode tuning post.

Figure 3:
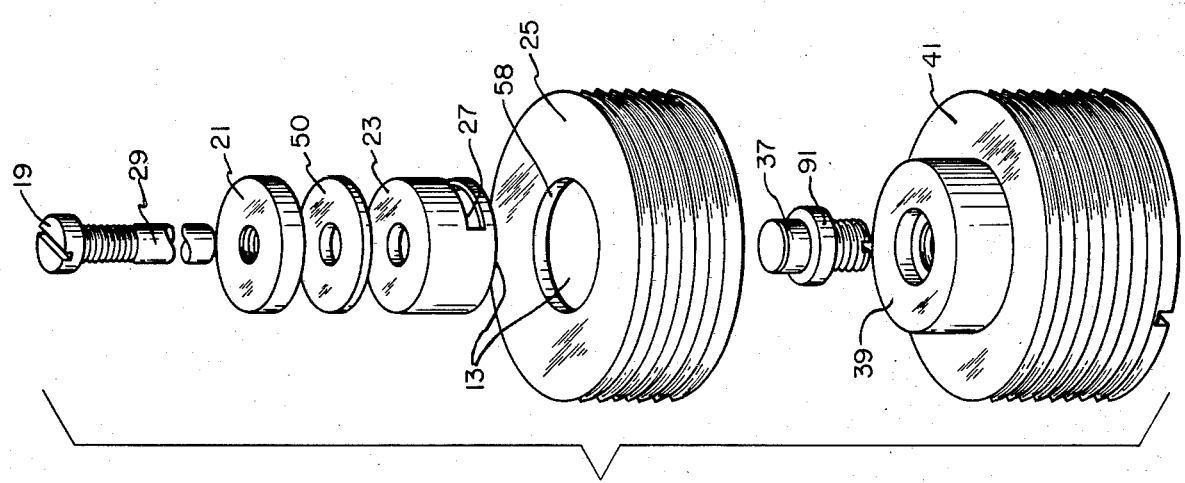
FIG. 3 is an exploded isometric representation of the component parts of the oscillator portion of apparatus according to the invention.

FIG. 3 of the drawing shows an exploded isometric view of the essential and important elements of the oscillator structure and illustrates the relative positions of the tuning post knob 19, tuning post 29, Gunn diode top mount 21, insulator washer 50, the cavity top cylinder 23 with the coupling slot 17 formed therein, the cavity bottom cylinder 25 and the cavity bottom closure cylinder 41 with a cavity bottom plug 39 formed integrally therewith. The Gunn diode 37 and diode mount 91 are shown in relative spaced relationship.

Figure 4:
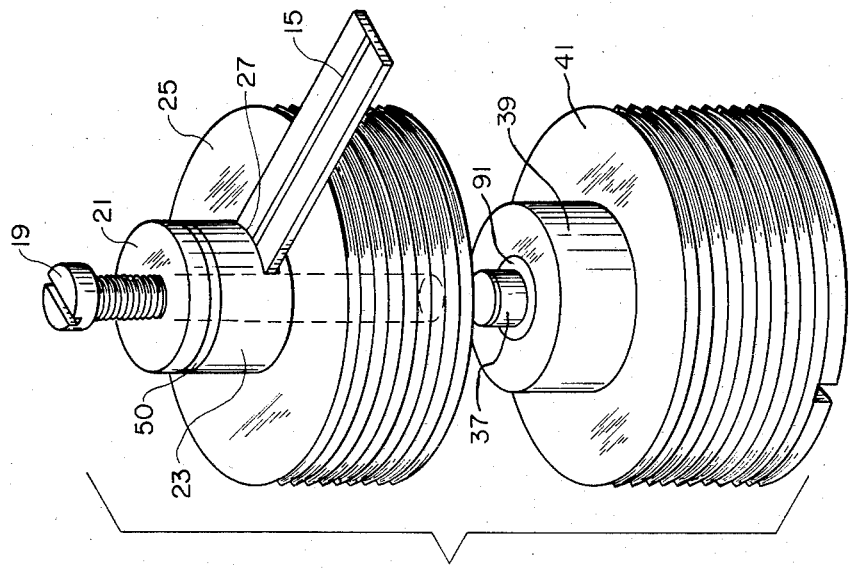
FIG. 4 is an isometric view of the component parts shown in FIG. 3 in the assembled condition.

FIG. 4 of the drawing shows the apparatus elements of FIG. 3 in their assembled condition with the microstrip transmission line 15 in place and with the probe 27 (shown in FIG. 1) extending through slot 17 into the interior of the resonating cavity 13. FIG. 4 is shown as a free body representation removed from the housing the more clearly to indicate the relative arrangement of the assembled parts of the Gunn diode structure with the microstrip transmission line 15 in place.

In operation, the apparatus is assembled as shown in the drawing figures with cavity bottom closure cylinder 41 threaded into the threaded bore of housing 11 to a preselected point commensurate with the frequency at which the apparatus is to oscillate. The cavity bottom cylinder 25 is threaded into the housing from the top, and cavity top cylinder 23 located in coaxial arrangement with the other parts, with top closure 21 in place and registered. The concentric Gunn diode tuning post 29 is in the assembly by threaded engagement through top closure 21, with its lower end bearing on the Gunn diode 37. To set the apparatus for a particular frequency, the vertical height of the resonating cavity is adjusted to approximately half the wavelength of the preselected frequency. With the apparatus set and suitable bias connected to the Gunn diode, the probe is arranged internally of the cavity 13 substantially at the midpoint of the vertical height of the cavity. The probe 27 is in linear alignment with the microstrip transmission line 15, and the transverse electromagnetic (TEM) wave developed in the cavity will be translated into the microstrip line under conditions of maximum power transfer and minimal impedance mismatch.

In a preferred working embodiment of the apparatus according to our invention as shown in the drawing figures, we have, in accordance with the foregoing description, placed a Gunn diode 37, with an overall diameter of 0.033 inch, which is mounted on diode mount 91, on the center of the shoulder portion of a brass cavity bottom plug 39 which has an overall shoulder diameter of 0.156 inch and having a threaded base of 0.375 inch diameter, threaded into brass housing 11. The bottom portion of the brass coaxial cavity consists of brass cavity bottom cylinder 25 with exterior threads of 0.375 inch diameter and smooth inner wall of 0.156 inch diameter with an upper flange 58 of 0.118 inch diameter and 0.015 inch thickness, and cavity bottom plug 39. The top portion of the coaxial cavity consists of a brass cavity top cylinder 23 with an inner smooth diameter of 0.120 inch and inner height of 0.05 inch, with a top opening of 0.05 inch diameter. A brass top mount 21 of outer diameter of 0.120 inch and threaded inner diameter of 0.045 inch and thickness of 0.07 inch, is insulated from the cavity top cylinder by interleaving insulator washer 50, which has an outer diameter of 0.20 inch, inner diameter of 0.05 inch and thickness of 0.02 inch. Both cavity top cylinder 23 and insulator washer 50 are adhesively fastened to the cavity top cylinder 23. The Gunn diode tuning post knob 19 and Gunn diode tuning post 29 comprise a single brass assembly which consists of a smooth cylindrical post of 0.025 inch diameter and 0.285 inch length and a threaded section of 0.045 inch diameter and 0.09 inch length and a tuning post knob 19 of 0.09 inch diameter and 0.07 inch length with a notched top for screwdriver adjustment. The front section of cavity top cylinder 23 is provided with a front coupling notch 17 of 0.120 inch width and 0.03 inch height into which is inserted a microstrip line section 15 terminated in a probe 27. Cavity 13 extends from the inner surface of cavity top cylinder 23 to the top inner surface of cavity bottom plug and wall 39. The cavity height is on the order of a half wavelength at the oscillator frequency. At 60 GHz, the height is approximately 0.10 inch. Gunn diode bias voltage of approximately 4 volts is applied to input connector 31, through microstrip bias filter 52 then through interconnecting wire 51 to brass top mount 21 and through tuning post 29 to Gunn diode 37.

In the light of the foregoing description, taken in conjunction with the illustration of the invention as shown in drawing figures, numerous alternative embodiments of our invention will undoubtedly occur to persons familiar with the art. These however, again in the light of the disclosure, will be well within the spirit of our invention, and it is therefore intended that this disclosure be taken as illustrative only and not construed in any limiting sense, it being our intention to define and limit the invention by the appended claims.

What is claimed is:

1. A millimeter-wave oscillator apparatus comprising, in combination, a housing having a variable volume resonating cavity generally cylindrical in shape with an access slot in a cylindrical cavity wall thereof located centrally of the longitudinal dimension of the cavity;

a solid state mechanically tunable element adjustably movable in said housing capable of producing a waveform energy output of a frequency relative to its position in said resonating cavity;

a microstrip transmission line juxtaposed to said resonating cavity;

a probe connected to and extending from said transmission line, through said slot and into said cavity; and position adjustment means on said mechanically tunable element operably accessible exteriorly of said housing.

2. Apparatus according to claim 1 wherein said solid state mechanically tunable element is threadedly engaged in said housing and is adjustably movable therein to vary the volume of the resonating cavity.

3. Apparatus according to claim 1 wherein said solid state mechanically tunable element is a Gunn diode.

* * * * *